(12) United States Patent
Sato

(10) Patent No.: US 7,263,012 B2
(45) Date of Patent: Aug. 28, 2007

(54) SEMICONDUCTOR STORAGE DEVICE

(75) Inventor: Kazuo Sato, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 2 days.

(21) Appl. No.: 10/545,749

(22) PCT Filed: Feb. 23, 2004

(86) PCT No.: PCT/JP2004/002089

§ 371 (c)(1),
(2), (4) Date: Aug. 15, 2005

(87) PCT Pub. No.: WO2004/077449

PCT Pub. Date: Sep. 10, 2004

(65) Prior Publication Data

US 2006/0164895 A1    Jul. 27, 2006

(30) Foreign Application Priority Data

Feb. 25, 2003  (JP) .............................. 2003-046770
Feb. 17, 2004  (JP) .............................. 2004-039596

(51) Int. Cl.
G11C 7/00    (2006.01)
(52) U.S. Cl. ...................................... 365/203; 365/207
(58) Field of Classification Search ................ 365/203, 365/205, 207
See application file for complete search history.

(56) References Cited

U.S. PATENT DOCUMENTS 5,297,092 A * 3/1994 Johnson ....................... 365/203
5,440,506 A * 8/1995 Longway et al. ........... 365/104
5,446,690 A   8/1995 Tanaka et al.
5,524,094 A   6/1996 Nobukata et al.
5,748,529 A   5/1998 Lee
6,185,142 B1  2/2001 Hotta
2002/0136067 A1  9/2002 Kojima

FOREIGN PATENT DOCUMENTS

| JP | 06-005085 | 1/1994 |
|---|---|---|
| JP | 7-57482 | 3/1995 |
| JP | 7-122080 | 12/1995 |
| JP | 8-221995 | 8/1996 |
| JP | 09-204788 | 8/1997 |
| JP | 10-021695 | 1/1998 |
| JP | 11-306782 | 5/1999 |
| JP | 2001-167591 | 6/2001 |
| JP | 2001-273776 | 10/2001 |
| JP | 2001-325794 | 11/2001 |
| JP | 2002-216483 | 8/2002 |

* cited by examiner

*Primary Examiner*—Vu A. Le
(74) *Attorney, Agent, or Firm*—Fish & Richardson P.C.

(57) ABSTRACT

A semiconductor storage device includes: a plurality of memory array cells (hereinafter, referred to as cells); a circuit arranged in each of the cells for precharge of each bit line of the cells to a predetermined voltage; and a circuit for comparing, for each bit line, an output voltage of each bit line of the cells selected for reading out data to an output voltage of each bit line of cells selected for reference. When the data is read out, the voltage value for precharge of the bit line of the cells selected for reading out data and the voltage value for precharge of the bit line of the cells selected for reference are temporarily set to different values. Thus, all the output bits of the cells selected for reading out data can be read out by a single read out operation.

16 Claims, 4 Drawing Sheets

SEMICONDUCTOR STORAGE DEVICE

TECHNICAL FIELD

The present invention relates to a semiconductor storage device. More specifically, the present invention relates to read operation from a nonvolatile semiconductor storage device such as a flash memory or EEPROM.

BACKGROUND ART

As an example of a conventional nonvolatile semiconductor storage device, a flash memory will be described below. An example of an outline of the configuration of a conventionally common flash memory is shown in FIG. 5.

In this example, each memory array cell 51 is composed of a large number of flash memory elements, and feeds the outputs of 1,024 bit lines to a multiplexer 52. Each multiplexer 52 is, on its output side, connected to sense amplifiers 53 that are provided one for every 128 bit lines. That is, each multiplexer 52 is, on its output side, connected to eight sense amplifiers 53. To the inverting input terminal of each sense amplifier 53 is connected a reference cell 54 that outputs a reference current. Here, each sense amplifier 53 is built as a current-to-voltage conversion amplifier.

This conventional flash memory includes a plurality of circuit blocks each including a memory array cell 51, a multiplexer 52, sense amplifiers 53, and reference cells 54 (FIG. 5 shows only two such circuit blocks).

In a read operation from the conventional flash memory shown in FIG. 5, first, from among the plurality of memory array cells, one with which to perform the read operation is selected, and the selected memory array cell then transfers the data stored therein to the multiplexer via 1,024 bit lines. The multiplexer 52 then outputs one chunk after another of the data fed thereto from the memory array cell to the individual sense amplifiers 53. Each sense amplifier 53 then compares the reference current fed from the reference cell 54 with the current fed from the multiplexer, and outputs a voltage that is commensurate with the difference between those currents.

In the flash memory shown in FIG. 5, eight sense amplifier are provided for each memory array cell, and a read operation is performed as described above. Consequently, a single read operation accomplishes the reading of as little as eight-bit data.

By providing more sense amplifiers for each memory array cell, it is possible to increase the number of data bits that can be read in a single read operation. This, however, is undesirable from the viewpoint of compactness because the sense amplifiers, which are of the current-to-voltage conversion type, require a large circuit area. Hence, it is unpractical to provide more than 16 sense amplifiers for each memory array cell. This limits the number of data bits that can be read from a conventional flash memory in a single read operation to eight to sixteen. This is the reason that read operation tends to be slow with conventional flash memories.

DISCLOSURE OF THE INVENTION

An object of the present invention is to provide a semiconductor storage device that permits fast read operation.

To achieve the above object, according to the present invention, a semiconductor storage device is provided with: a plurality of memory array cells; precharge circuits, provided one for each memory array cell, for precharging each bit line of the memory array cell with a predetermined voltage; and a comparing circuit for comparing, for each bit line, the output voltage of each bit line of the memory array cell currently being selected for a data read operation and the output voltage of each bit line of the memory array cell currently being selected as a reference. Here, in the data read operation, the voltage with which the bit line of the memory array cell selected for the data read operation is precharged and the voltage with which the bit line of the memory array cell selected as the reference is precharged are made temporarily different.

With this configuration, all the output bits (for example, 1,024 bits) of the main array cell currently being selected for a data read operation can be read in a single read operation. Consequently, semiconductor storage devices according to the present invention permit dramatically faster read operation than conventional ones, which permit only eight to sixteen bits to be read in a single read operation.

BEST MODE FOR CARRYING OUT THE INVENTION

Figure 1:
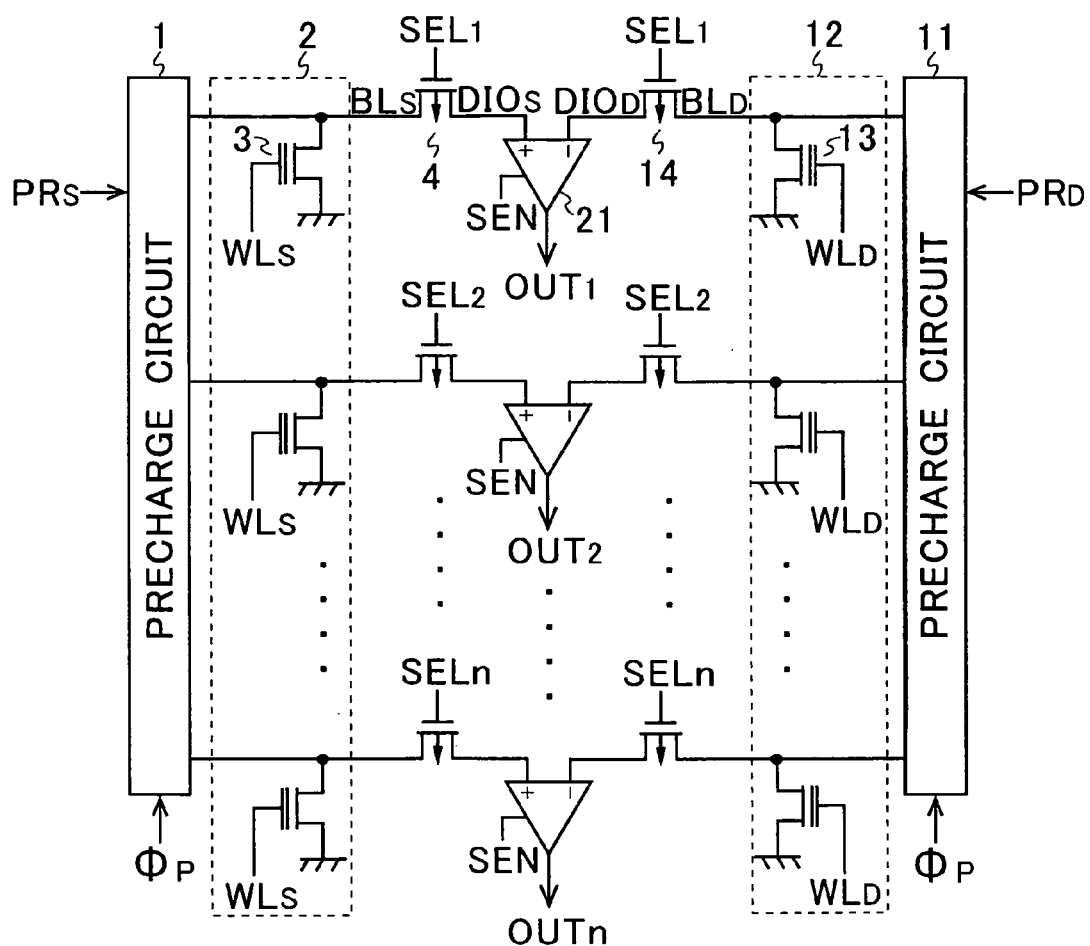
FIG. 1 is a diagram showing an example of an outline of the configuration of a nonvolatile memory according to the invention.

Hereinafter, an embodiment of the present invention will be described with reference to the drawings. The following descriptions deal with, as an example of a semiconductor storage device according to the invention, a nonvolatile memory such as a flash memory or EEPROM. FIG. 1 shows an example of an outline of the configuration of a nonvolatile memory according to the invention, assuming that it is given a memory size comparable with that of the conventional flash memory.

Of all memory array cells, those in which data to be read is present are hereinafter referred to as main array cells. Each main array cell 2 has 1,024 nonvolatile memory cells 3. Each bit line of the main array cell 2 is connected to one of the output terminals of a precharge circuit 1. That is, the precharge circuit 1 has 1,024 output terminals. Each bit line of the main array cell 2 is also connected through a P-channel MOSFET (metal-oxide-semiconductor field-effect transistor) 4 to the non-inverting input terminal of a sense amplifier 21.

Likewise, the memory array cell 12 with which to compare the main array cell 2 has 1,024 nonvolatile memory cells 13. Each bit line of the memory array cell 12 is connected to one of the output terminals of a precharge circuit 11. That is, the precharge circuit 11 has 1,024 output terminals. Each bit line of the memory array cell 12 is also connected through a P-channel MOSFET 14 to the inverting input terminal of a sense amplifier 21.

The precharge circuit 1 receives a precharge signal $\Phi_p$ and a 1V precharge signal $PR_S$, and the precharge circuit 11 receives the precharge signal $\Phi_p$ and a 1V precharge signal $PR_D$. The P-channel MOSFETs 4 and 14 each receive, at their gates, a selection signal SELn (where n is an integer number fulfilling $1 \leq n \leq 1,024$). All the memory cells 3 within the main array cell 2 each receive, at their control gates, a word line signal $WL_S$, and all the memory cells 13 within the memory array cell 12 each receive, at their control gates, a word line signal $WL_D$. Moreover, an operation control signal SEN for switching the sense amplifiers 21 between an operating and a non-operating state is fed to each of the sense amplifiers 21.

The sense amplifiers 21 are each built as a voltage amplifier that outputs a voltage signal obtained by amplifying the difference between the two input voltages thereto. Thus, the sense amplifiers 21 require a smaller circuit area than the current-to-voltage conversion amplifiers used in the conventional flash memory. For the sake of simplicity, FIG. 1 shows only one circuit block (hereinafter referred to as a basic circuit) that is configured as described above, including the precharge circuit 1, main array cell 2, P-channel MOSFETs 4, precharge circuit 11, memory array cell 12, P-channel MOSFETs 14, and sense amplifiers 21. In reality, the nonvolatile memory according to the invention includes a plurality of such basic circuits, of which one is selected at a time with the selection signal SELn. The sense amplifiers may be shared among the plurality of basic circuits so that the nonvolatile memory as a whole has n or m sense amplifiers (where m is a natural number fulfilling $m \leq n$). In this case, to the input terminal of each sense amplifier are connected a plurality of P-channel MOSFETs, and these P-channel MOSFETs function as a multiplexer.

Figure 2:
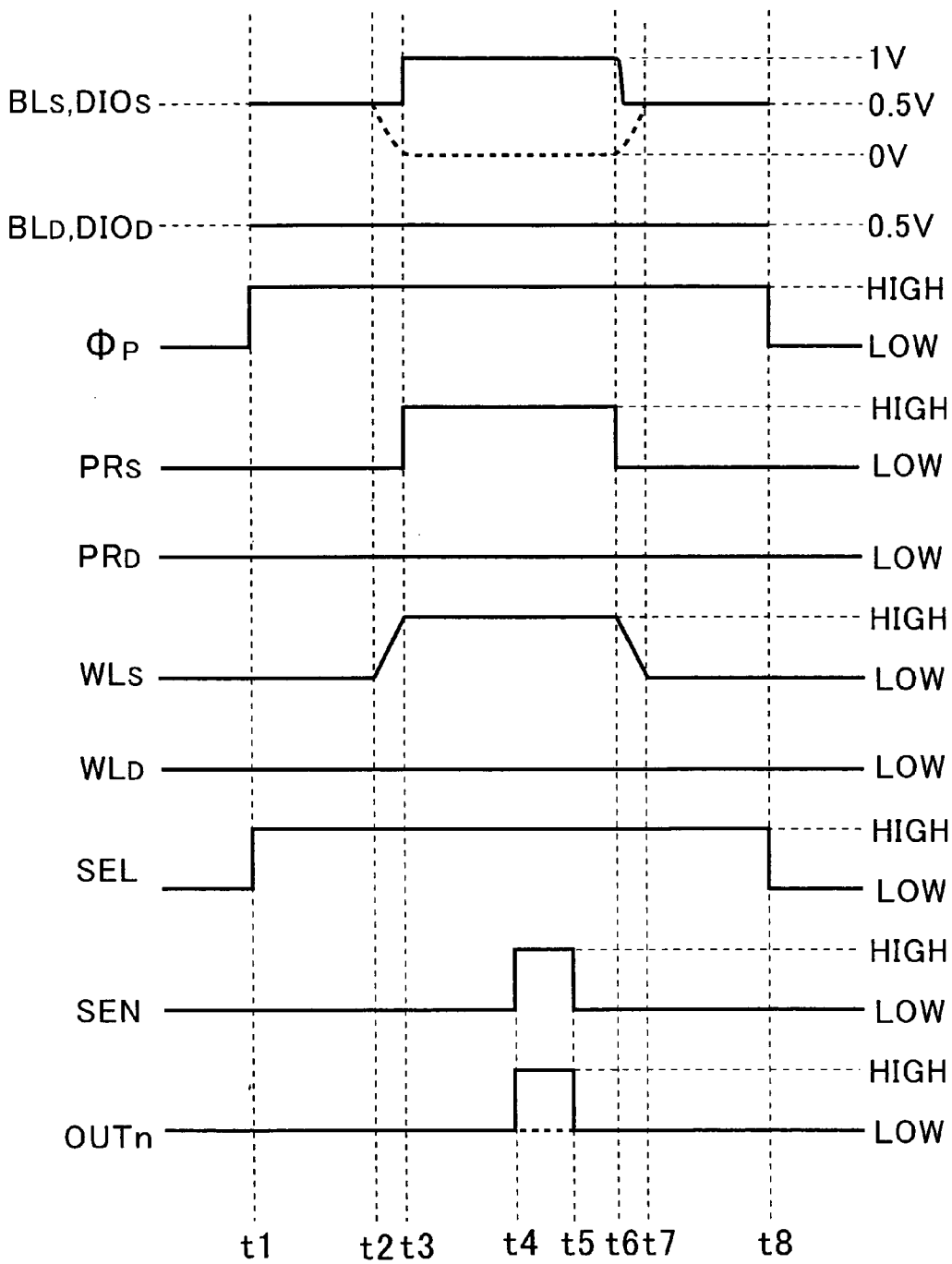
FIG. 2 is a time chart showing the signal waveforms observed at relevant points in the nonvolatile memory shown in FIG. 1.

Next, how a read operation is performed in the nonvolatile memory according to the invention shown in FIG. 1 will be described with reference to FIG. 1 and the time chart shown in FIG. 2. The following description discusses the operation performed when the m-th data bit (where m is a natural number fulfilling $m \leq n$) is read from the memory array cells 2 and 12. In the following description and in FIG. 2, indications of "m" are omitted.

Before the read operation, the precharge signal $\Phi_p$, the 1V precharge signal $PR_S$, the 1V precharge signal $PR_D$, the word line signal $WL_S$, the word line signal $WL_D$, the selection signal SEL, the operation control signal SEN, and the output signal are all low.

The precharge signal $\Phi_p$ and the selection signal SEL turn from low to high at time point t1, and remain high up till time point t8, when they turn low, and thereafter remain low. Accordingly, the bit line signals $BL_S$, the voltage signals $DIO_S$, the bit line signals $BL_D$, and the voltage signals $DIO_D$ are all significant during the period from t1 to t8, and remain indefinite during the rest of time.

The 1V precharge signal $PR_S$ for the side of the memory array cell from which data is read (i.e., the main array cell 2 (this applies wherever applicable)) turns from low to high at time point t3, and remains high up till time point t6, when it turns from high to low, and thereafter remains low. On the other hand the 1V precharge signal $PR_D$ for the side of the memory array cell from which no data is read (i.e., the memory array cell 12 (this applies wherever applicable)) remains low throughout.

The precharge circuit 1 outputs 0.5 V when the precharge signal $\Phi_P$ is high and simultaneously the 1V precharge signal $PR_S$ is low, and outputs 1 V when the precharge signal $\Phi_P$ is high and simultaneously the 1V precharge signal $PR_S$ is high. On the other hand, the precharge circuit 11 outputs 0.5 V when the precharge signal $\Phi_P$ is high and simultaneously the 1V precharge signal $PR_D$ is low, and outputs 1 V when the precharge signal $\Phi_P$ is high and simultaneously the 1V precharge signal $PR_D$ is high.

The word line signal $WL_S$ for the side of the memory array cell from which data is read gradually increases starting at time point t2, becomes high at time point t3, remains high up till time point t6, then gradually decreases starting at time point t6, becomes low at time point t7, and thereafter remains low.

Accordingly, if a given memory cell 3 within the memory array cell from which data is read has data written thereto, the memory cell does not turn on, with the result that the bit line signal $BL_S$ and the voltage signal $DIO_S$ remain 0.5 V during the period from t1 to t3, rise to 1 V at time point t3, then remain 1 V up till time point t6, then gradually decrease starting at time point t6 until they reach 0.5 V, and thereafter remain 0.5 V. By contrast, if a given memory cell 3 within the memory array cell from which data is read has no data written thereto, the memory cell turns on, with the result that the bit line signal $BL_S$ and the voltage signal $DIO_S$ remain 0.5 V during the period from t1 to t2, then gradually decrease starting at time point t2, reach 0 V at time point t3, remain 0 V up till time point t6, then gradually increase starting at time point t6, reach 0.5 V at time point t7, and then remain 0.5 V up till the time point t8 (for the period from t2 to t7, see the broken line in FIG. 2).

The word line signal $WL_D$ for the side of the memory array cell from which no data is read remains low throughout. Accordingly, irrespective of whether a given memory cell 13 has data written thereto or not, the bit line signal $BL_D$ and the voltage signal $DIO_D$ remain 0.5 V during the period from t1 to t8.

The operation control signal SEN is high only during the period from t4 to t5. Accordingly, reading a memory cell having data written thereto within the memory array cell from which data is read causes the output signal $OUT_m$ (where m is a natural number fulfilling $1 \leq m \leq n$) to remain high only during the period from t4 to t5. By contrast, reading a memory cell having no data written thereto within the memory array cell from which data is read leaves the output signal $OUT_l$ (where l is a natural number fulfilling $1 \leq l \leq n$) to remain low also during the period from t4 to t5 (for the period from t4 to t5, see the broken line in FIG. 2).

In this way, it is possible to read, in a single read operation, all the output bits of the memory array cell from which data is read. That is, in this embodiment, it is possible to read n-bit data in a single read operation. Specifically, it is possible to read, for example, 1,024-bit data at a time. In a case where data is read from the memory array cell 12 that is connected to the inverting input terminals of the sense amplifiers, by inverting the output signals $OUT_n$ with inverters, it is possible to obtain signals similar to the output signals obtained when data is read from the main array cell 2 that is connected to the non-inverting input terminals of the sense amplifiers. In this case, it is from the memory array cell 12 that data is read, and therefore the memory array cell 12 behaves as a main memory cell. The descriptions above deal with a case where 1,024-bit data is handled. Needless to say, data having any other number of bits may be handled instead. The present invention helps effectively reduce the circuit area when applied to, in particular, a flash memory, which is a kind of nonvolatile memory. However, the present invention may be applied also to a memory that is not nonvolatile, i.e., to a volatile memory. An example of the configuration of a volatile memory according to the invention can be obtained by replacing the memory cells 3 and 12 in the nonvolatile memory shown in FIG. 1 with volatile memory cells.

Figure 3:
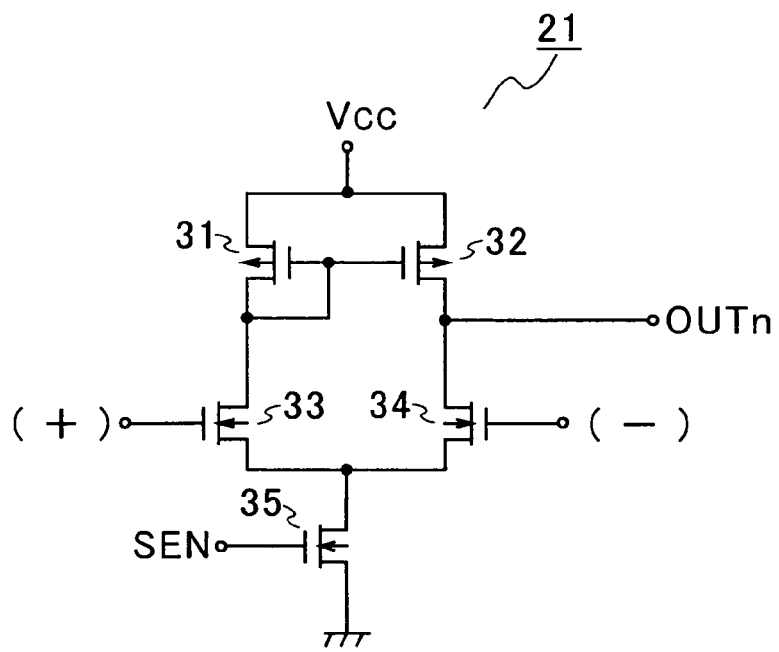
FIG. 3 is a diagram showing an example of the configuration of the sense amplifier provided in the nonvolatile memory shown in FIG. 1.

Next, practical examples of the configuration of the sense amplifier 21 will be described. An example of the configuration of the sense amplifier 21 is shown in FIG. 3. A terminal to which a constant voltage $V_{CC}$ is applied is connected to the source of a P-channel MOSFET 31 and to the source of a P-channel MOSFET 32. The gate of the P-channel MOSFET 31 and the gate of the P-channel MOSFET 32 are connected together. The gate and drain of the P-channel MOSFET 31 are connected together.

The drain of the P-channel MOSFET 31 is connected to the drain of an N-channel MOSFET 33. The drain of the P-channel MOSFET 32 is connected to a terminal from which the output signal $OUT_n$ is outputted and to the drain of an N-channel MOSFET 34.

A terminal that serves as the non-inverting input terminal (+) of the sense amplifier is connected to the gate of the N-channel MOSFET 33. A terminal that serves as the inverting input terminal (−) of the sense amplifier is connected to the gate of the N-channel MOSFET 34.

The source of the N-channel MOSFET 33 and the source of the N-channel MOSFET 34 are connected together, and are connected to the drain of an N-channel MOSFET 35. The gate of the N-channel MOSFET 35 is connected to a terminal to which the operation control signal SEN is fed. The source of the N-channel MOSFET 35 is grounded.

Figure 4:
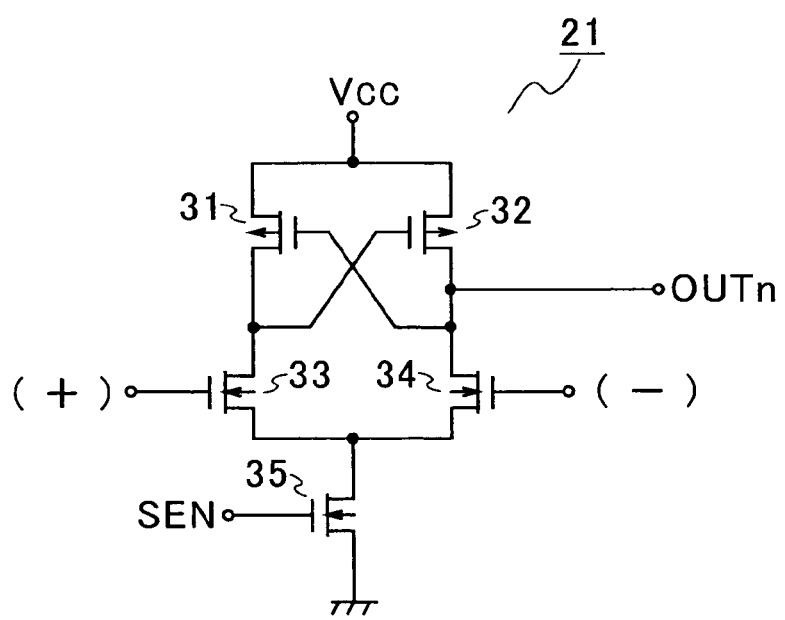
FIG. 4 is a diagram showing another example of the configuration of the sense amplifier provided in the nonvolatile memory shown in FIG. 1.
Figure 5:
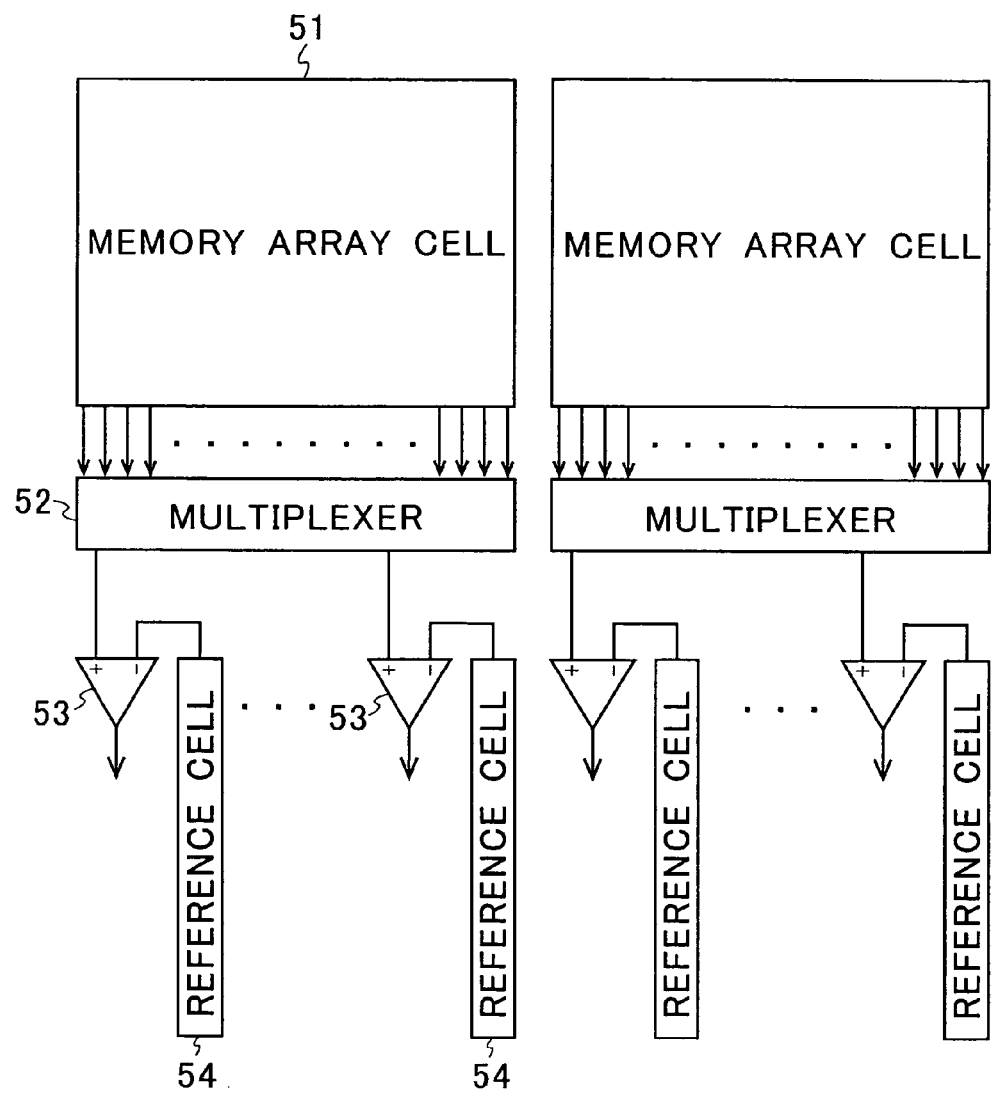
FIG. 5 is a diagram showing an example of an outline of the configuration of a conventional flash memory.

Another example of the configuration of the sense amplifier 21 is shown in FIG. 4. In FIG. 4, such circuit elements as are found also in FIG. 3 are identified with common reference numerals, and their detailed explanations will be omitted. The sense amplifier shown in FIG. 4 differs from the sense amplifier shown in FIG. 3 in the following respects. In the sense amplifier shown in FIG. 3, the gate of the P-channel MOSFET 31 and the gate of the P-channel MOSFET 32 are connected together. By contrast, in the sense amplifier shown in FIG. 4, the gate of the P-channel MOSFET 31 is connected to the node at which the drain of the P-channel MOSFET 32, the terminal from which the output signal OUT is outputted, and the drain of the N-channel MOSFET 34 are connected together; the gate of the P-channel MOSFET 32 is connected to the node at which the drain of the P-channel MOSFET 31 and the drain of the N-channel MOSFET 33 are connected together; and the gate and drain of the P-channel MOSFET 31 are not connected together.

INDUSTRIAL APPLICABILITY

Nonvolatile memories according to the present invention find application in computers and the like.

The invention claimed is:

1. A semiconductor storage device comprising:
a plurality of first bit lines;
a plurality of second bit lines corresponding to said first bit lines, respectively;
a plurality of memory cells, provided one for each first bit line, to be connected to said first bit lines, respectively;
a precharge circuit for precharging said memory cells;
a reference voltage circuit for supplying said second bit lines with a reference voltage, respectively; and
a plurality of comparing circuits arranged one for each first bit line, each of said comparing circuits comparing an output voltage at each first bit line and a reference voltage at the corresponding second bit line, respectively, to simultaneously read the data stored in the memory cells.

2. The semiconductor storage device of claim 1, wherein, in the data read operation, the voltage with which said precharge circuit precharges said memory cells and the reference voltage with which said reference voltage circuit supplies said second bit lines are made temporarily different.

3. A semiconductor storage device comprising:
a plurality of first bit lines;
a plurality of second bit lines corresponding to said first bit lines, respectively;
a plurality of word lines, one of which is to be selected;
a plurality of memory arrays, provided one for each word line, each including a plurality of memory cells, provided one for each first bit line, to be connected to said first bit lines, respectively;
a precharge circuit for precharging said memory cells through said first bit lines;
a reference voltage circuit for supplying a reference voltage with said second bit lines; and
a plurality of comparing circuits arranged one for each first bit line, each of said comparing circuits comparing an output voltage at each first bit line and the reference voltage at the corresponding second bit line, respectively, to simultaneously read the data stored in the memory cells in one of the memory arrays at the selected word line.

4. The semiconductor storage device of claim 3, wherein, in the data read operation, the voltage with which said precharge circuit precharges said memory cells in the memory array at the selected word line and the reference voltage with which said reference voltage circuit supplies said second bit lines are made temporarily different.

5. A semiconductor storage device comprising:
a plurality of first bit lines;
a plurality of second bit lines corresponding to said first bit lines, respectively;
a first memory array, provided for a first word line, including a plurality of first memory cells, provided one for each first bit line, to be connected to said first bit lines, respectively;
a second memory array, provided for a second word line, each including a plurality of second memory cells, provided one for each second bit line, to be connected to said second bit lines, respectively;
a first precharge circuit for precharging said first memory cells through said first bit lines;
a second precharge circuit for precharging said second memory cells through said second bit lines; and
a plurality of comparing circuits arranged one for each first bit line, each of said comparing circuits comparing an output voltage at each first bit line and an output voltage at the corresponding second bit line, respectively, to simultaneously read the data stored in the memory cells in one of said first memory array and said second memory array.

6. The semiconductor storage device of claim 5, wherein, in the data read operation of the memory cells in one of said first memory array and said second memory array, the voltage with which said first precharge circuit precharges said first bit lines and the voltage with which said second precharge circuit precharges said second bit lines are made temporarily different.

7. A semiconductor storage device comprising:
a plurality of first bit lines;

a plurality of second bit lines corresponding to said first bit lines, respectively;

a plurality of first word lines;

a plurality of second word lines;

a plurality of first memory arrays, provided one for each first word line, each including a plurality of first memory cells, provided one for each first bit line, to be connected to said first bit lines, respectively;

a plurality of second memory arrays, provided one for each second word line, each including a plurality of second memory cells, provided one for each second bit line, to be connected to said second bit lines, respectively;

a first precharge circuit for precharging said first memory cells through said first bit lines;

a second precharge circuit for precharging said second memory cells through said second bit lines; and a plurality of comparing circuits arranged one for each first bit line, each of said comparing circuits comparing an output voltage at each first bit line and an output voltage at the corresponding second bit line, respectively, to simultaneously read the data stored in the memory cells in one of said first and second memory arrays at a selected one word line among said first and second word lines.

8. The semiconductor storage device of claim 7, wherein, in the data read operation of the memory cells in one of said first memory arrays and said second memory arrays, the voltage with which said first precharge circuit supplies said first bit lines and the voltage with which said second precharge circuit supplies said second bit lines are made temporarily different.

9. The semiconductor storage device of claim 1, wherein each of the comparing circuits is built as a plurality of voltage amplifiers.

10. The semiconductor storage device of claim 3, wherein each of the comparing circuits is built as a plurality of voltage amplifiers.

11. The semiconductor storage device of claim 5, wherein each of the comparing circuits is built as a plurality of voltage amplifiers.

12. The semiconductor storage device of claim 7, wherein each of the comparing circuits is built as a plurality of voltage amplifiers.

13. The semiconductor storage device of claim 9, wherein a memory array including the memory cells is a flash memory cell.

14. The semiconductor storage device of claim 10, wherein the memory arrays are flash memory cells.

15. The semiconductor storage device of claim 11, where said first and second memory arrays are flash memory cells.

16. The semiconductor storage device of claim 12, wherein said first and second memory arrays are flash memory cells.

* * * * *